United States Patent [19]

Heeger et al.

[11] 4,222,903
[45] Sep. 16, 1980

[54] P-TYPE ELECTRICALLY CONDUCTING DOPED POLYACETYLENE FILM AND METHOD OF PREPARING SAME

[75] Inventors: Alan J. Heeger, Wynnewood; Alan G. MacDiarmid, Drexel Hill; Chwan K. Chiang, Upper Darby, all of Pa.; Hideki Shirakawa, Yokohama, Japan

[73] Assignee: University Patents, Inc., Norwalk, Conn.

[21] Appl. No.: 902,667

[22] Filed: May 4, 1978

[51] Int. Cl.$^2$ .............................................. H01B 1/06
[52] U.S. Cl. ..................................... 252/518; 252/500
[58] Field of Search ...................... 252/500, 518; 357/8

[56] References Cited
PUBLICATIONS

Ito et al., Journal of Polymer Science, Part A-1, Polymer Chemistry Edition, vol. 13, pp. 1943-1950 (1975).
Abstracts of Papers American Chemical Society 175th ACS Meeting, Mar. 13-17, 1978, Abstract 121.
Bulletin of the American Physical Society, vol. 23, No. 3, Mar. 1978, p. 304.
Shirakawa et al., J. C. S. Chem. Comm., pp. 578-580 (Sep. 1977).
Chiang et al., Physical Review Letters, vol. 39, No. 17, pp. 1098-1101 (Oct. 1977).
Berets, et al., Trans. Faraday Soc., vol. 64, pp. 823-828 (1968).
Shirakawa et al., Polymer Journal, vol. 2, No. 2, pp. 231-244 (1971).
Shirakawa et al., Polymer Journal, vol. 4 No. 4, pp. 460-462 (1973).
Ito et al., Journal of Polymer Science, Part A-1, Polymer Chemistry Edition, vol. 12, pp. 11-20 (1974).

Primary Examiner—Benjamin R. Padgett
Assistant Examiner—J. L. Barr
Attorney, Agent, or Firm—Jerome M. Teplitz; A. Sidney Alpert; David N. Koffsky

[57] ABSTRACT

Electrically conducting organic polymeric material having a preselected room temperature p-type electrical conductivity which may vary over the entire range characteristic of semiconductor behavior and into the range characteristic of metallic behavior, is prepared by controlled chemical doping of polyacetylene in the form of a polycrystalline film. Exceptionally high room temperature p-type electrical conductivity within the range of from about 0.1 to of the order of $10^3$ ohm$^{-1}$ cm$^{-1}$ is achieved with several electron acceptor dopants, including bromine, iodine, iodine chloride, iodine bromide and arsenic pentafluoride.

13 Claims, No Drawings

P-TYPE ELECTRICALLY CONDUCTING DOPED POLYACETYLENE FILM AND METHOD OF PREPARING SAME

BACKGROUND OF THE INVENTION

The Government has rights in this invention pursuant of Contract No. N00014-75-C-0962 awarded by the Office of Naval Research.

This invention relates to electrically conducting organic polymeric material and, more particularly, to the selective modification of the room temperature electrical conductivity of polyacetylene by controlled chemical doping thereof.

For use in a wide variety of electronic device applications, it is highly desirable to have available electrically conducting materials having a preselected room temperature electrical conductivity varying over a broad range extending from slightly conducting to highly conducting. A number of semiconducting organic materials are known whose room temperature electrical conductivities may be varied over several orders of magnitude in the lower region of such range by appropriate chemical doping with electron acceptor and/or electron donor dopants. However, such doping techniques have not generally proven to be successful in achieving increases in room temperature electrical conductivity to the degree necessary for rendering these materials highly conductive to the point of exhibiting or approaching metallic behavior.

One of the materials whose electrical conductivity properties have previously been modified by chemical doping, is the p-type semiconducting organic polymer, polyacetylene, $(CH)_x$, prepared in the form of a powder. Studies on the effects of chemical doping with electron acceptors and donors on the room temperature electrical conductivity of polyacetylene powder compressed into a pellet, have been reported by Berets et al, Trans. Faraday Soc., Volume 64, pages 823-828 (1968). These studies showed that the initial room temperature p-type electrical conductivity of the polymer (on the order of about $10^{-6}$ ohm$^{-1}$ cm$^{-1}$) could be increased by a factor as high as $10^3$ by electron acceptor doping, and decreased by a factor as high as $10^4$ by electron donor doping. Thus, while Berets et al indicate the possibility of varying the room temperature p-type electrical conductivity of polyacetylene powder over a range of approximately seven orders of magnitude, the highest room temperature electrical conductivity which they are able to achieve is still relatively low, on the order of only $10^{-3}$ ohm$^{-1}$ cm$^{-1}$.

Recently, polyacetylene has been successfully synthesized in the form of high quality uniformly thin flexible copper-colored polycrystalline films of cis-polyacetylene and silvery polycrystalline films of trans-polyacetylene, by polymerizing acetylene monomer in the presence of a $Ti(OC_4H_9)_4$ $Al(C_2H_5)_3$ catalyst system, employing a critical catalyst concentration to avoid the formation of polyacetylene powder, and critical polymerization temperatures (temperatures lower than −78° C. for obtaining the cis polymer, and temperatures higher than 150° C. for obtaining the trans polymer). The details of the synthesis of these polycrystalline films of polyacetylene and their characterization are described in a series of papers by Shirakawa et al (Polymer Journal, Volume 2, No. 2, pages 231-244, 1971; Polymer Journal, Volume 4, No. 4, pages 460-462, 1973; Journal of Polymer Science, Part A-1, Polymer Chemistry Edition, Volume 12, pages 11-20, 1974; and Journal of Polymer Science, Part A-1, Polymer Chemistry Edition, Volume 13, pages 1943-1950, 1975), all of which are incorporated herein by reference.

The polycrystalline films of trans-polyacetylene and cis-polyacetylene described by Shirakawa et al, are both p-type semiconducting materials, but varying in room temperature electrical conductivity. The room temperature electrical conductivity of the trans-polyacetylene is typically about $4.4 \times 10^{-5}$ ohm$^{-1}$ cm$^{-1}$, while that of the cis-polyacetylene is typically about $1.7 \times 10^{-9}$ ohm$^{-1}$ cm$^{-1}$ depending on the method of preparation.

SUMMARY OF THE INVENTION

It is, accordingly, a primary object of the present invention to provide a p-type electrically conducting organic polymeric material exhibiting a high room temperature electrical conductivity characteristic of or approaching metallic behavior.

Another object of the invention is to provide a p-type electrically conducting organic polymeric material whose room temperature electrical conductivity may be preselected within a broad range of selectivity extending over the entire range characteristic of semiconductor behavior and into the range characteristic of metallic behavior.

A further object of the invention is to provide an improved method for the chemical doping of a p-type semiconducting polyacetylene starting material which enables the range of selectivity of the room temperature p-type electrical conductivity of the resulting doped material to be broadened to extend over the entire range characteristic of semiconductor behavior and into the range characteristic of metallic behavior.

The above and other objects are achieved in accordance with the present invention by the controlled chemical doping of a semiconducting polyacetylene starting material in the form of a polycrystalline film, to p-type with a conductivity-increasing amount of an electron acceptor dopant. It has been found that when the polyacetylene is in polycrystalline film form rather than in powder form, the electrical conductivity-modifying effects of chemical doping thereof are substantially enhanced so as to provide greater selectivity in the final room temperature p-type electrical conductivity of the resulting doped material, particularly at the upper end of the range of selectivity. Exceptionally high levels of room temperature p-type electrical conductivity, ranging from about 0.1 to of the order of $10^3$ ohm$^{-1}$ cm$^{-1}$, can be achieved with a number of electron acceptor dopants, including bromine, iodine, iodine chloride, iodine bromide and arsenic pentafluoride, at dopant levels ranging from less than 0.001 to about 0.3 mol of dopant per —CH— unit of the polyacetylene, with lower doping levels resulting in proportionally lower conductivity increases.

The improved doping method of the present invention thus enables the production of a whole family of p-type electrically conducting doped polyacetylene films whose room temperature electrical conductivity may be preselected over the entire range characteristic of semiconductor behavior and into the range characteristic of metallic behavior, so as to be suitable for use in a wide variety of electronic device applications.

DESCRIPTION OF PREFERRED EMBODIMENTS

In carrying out the doping method in accordance with the present invention, the polyacetylene starting material is in the form of a polycrystalline film which may be prepared, for example, by the methods described in the Shirakawa et al papers referred to above and incorporated herein by reference. Depending on the polymerization temperature employed in preparing such films, the polyacetylene may have an all cis structure (polymerization temperatures lower than $-78°$ C.), an all trans structure (polymerization temperatures higher than $150°$ C.), or a mixed cis-trans structure (polymerization temperatures between $-78°$ C. and $150°$ C.). While any of these polycrystalline polyacetylene films may suitably by employed in carrying out the doping method in accordance with the present invention, highest room temperature electrical conductivities are generally obtained when the doped material is prepared from a cis-polyacetylene starting film.

A wide variety of doping materials may suitably by employed in doping the starting polyacetylene film for effectively modifying its room temperature electrical conductivity. Since the conductivity of the starting polyacetylene will be relatively low to begin with, i.e., on the order of about $10^{-9}$ to $10^{-5}$ ohm$^{-1}$ cm$^{-1}$ depending upon its relative cis and trans content, the required modification for most practical applications will be to effect an increase in conductivity. Dopants suitable for effecting an increase in the room temperature p-type electrical conductivity of the polyacetylene starting material are electron acceptor dopants, including, for example, $Br_2$, $I_2$, $ICl$, $IBr$, $AsF_5$, $Cl_2$, $HBr$, $BF_3$, $BCl_3$, $SO_2$, $SO_3$, $SO_2Cl_2$, $POF_3$, $NO_2$, $HCN$, $ICN$, $O_2$, $SiF_4$, $NO$, $C_2H_2$, and transition metal carbonyl, phosphine and olefin derivatives. Each of these electron acceptor dopants will effect an increase, to varying degrees, in the room temperature p-type electrical conductivity of the polyacetylene starting material. The most dramatic increases in such conductivity, to within the range of from about 0.1 to of the order of $10^3$ ohm$^{-1}$ cm$^{-1}$, have been obtained when the electron acceptor dopant is selected from the group consisting of bromine, iodine, iodine chloride, iodine bromide, and arsenic pentafluoride. Of these five preferred electron acceptor dopants for use in the present invention, arsenic pentafluoride has been found to be capable of effecting the largest conductivity increase.

It may sometimes be desirable to decrease the initial room temperature p-type electrical conductivity of the polyacetylene starting material or to compensate to some degree the increased room temperature p-type electrical conductivity of the electron acceptor-doped polyacetylene. This may be effected by doping the polyacetylene material with trace amounts of a suitable electron donor dopant, such as, for example, ammonia or methylamine.

The extent to which any given electron acceptor dopant will increase the conductivity of the polyacetylene film will depend upon the degree of doping up to a certain point at which the maximum conductivity is obtained for that dopant. Such maximum conductivity will generally be obtained at a degree of doping not greater than about 0.30 mol of electron acceptor dopant per —CH— unit of the polyacetylene. For obtaining the high electrical conductivities characteristic of or approaching metallic behavior, i.e., within the range of from about 0.1 to of the order of $10^3$ ohm$^{-1}$ cm$^{-1}$, with the preferred electron acceptor dopants of the present invention, i.e., bromine, iodine, iodine chloride, iodine bromide and arsenic pentafluoride, the degree of doping should be within the range of from less than 0.001 to 0.3 mol of electron acceptor dopant per —CH— unit of the polyacetylene.

The highest room temperature p-type electrical conductivity thus far achieved in accordance with the present invention, i.e., 880 ohm$^{-1}$ cm$^{-1}$, was obtained with arsenic pentafluoride-doped cis-polyacetylene film containing about 0.1 mol of arsenic pentafluoride per —CH— unit of the polyacetylene.

In carrying out the method of the present invention for producing a p-type doped polyacetylene film having a preselected room temperature electrical conductivity, a dopant material is selected whose maximum conductivity-modifying capability is at least sufficiently great to achieve such preselected value. The film is contacted with the dopant, which may be either in the vapor phase or in solution, whereby uptake of the dopant molecules into the polyacetylene molecules occurs to a degree proportional to the dopant concentration and the contacting period. The contacting period is controlled so that the corresponding degree of doping will be such as to provide the resulting doped polyacetylene film with the preselected room temperature p-type electrical conductivity. For example, with the preferred electron acceptor dopants in accordance with the present invention, i.e., bromine, iodine, iodine chloride, iodine bromide and arsenic pentafluoride, the starting polyacetylene film may be contacted in vacuum with the vapor of the electron acceptor dopant for a contacting period ranging from a few seconds to about twenty-four hours to provide a degree of doping within the range of from less than 0.001 to 0.3 mol of electron acceptor dopant per —CH— unit of the polyacetylene, and thereby provide the doped polyacetylene film with a preselected room temperature p-type electrical conductivity within the range of from about 0.1 to of the order of $10^3$ ohm$^{-1}$ cm$^{-1}$.

A preferred doping procedure is to fill a vessel with strips of the polyacetylene film to be doped, including a reference strip of the film which is suitably attached to electrodes for monitoring purposes. The vessel is then evacuated, and the vapor of the dopant is then allowed to enter the vessel. The conductivity of the reference film strip is monitored as the doping proceeds, and when the preselected conductivity is reached, the dopant vapor is pumped out of the container. Since all of the polyacetylene film strips in the container have been exposed to the same gaseous environment as the reference film strip, these strips will have the same conductivity as the reference film strip.

The doping procedure may also be carried out by placing the starting polyacetylene film in a solution of the dopant in an appropriate organic solvent inert to the polyacetylene, such as, for example, benzene, cyclohexane, or the like. By trial and error, it is found for what length of time it is necessary to leave the polyacetylene film in the solution to obtain the desired degree of doping. At the completion of the doping period, the doped film is removed from the doping solution and rinsed in an additional amount of the organic solvent to remove any residual doping solution therefrom, and the excess solvent is then pumped off in a high vacuum.

The invention is further illustrated by way of the following examples, wherein the polyacetylene starting materials were in the form of polycrystalline films typically 0.1 micron to 1.0 mm in thickness, prepared by the methods described in the Shirakawa et al papers referred to above, and composed either of cis-polyacetylene or trans-polyacetylene or polyacetylene consisting of the cis and trans configurations in any relative amounts.

EXAMPLE 1

Samples of polycrystalline polyacetylene film in an evacuated reaction vessel were exposed to the vapor of several different electron acceptor dopants for various contacting periods ranging from a few seconds to about twenty-four hours. The electron acceptor dopants employed included hydrogen bromide, chlorine, bromine, iodine, iodine chloride, iodine bromide and arsenic pentafluoride. At the end of the contacting period, the room temperature electrical conductivity of the doped film was measured using four-probe dc techniques. The final compositions of the doped films were determined by elemental analysis and/or by the increase in weight of the film during doping. The resulting composition of the doped films and their corresponding room temperature p-type electrical conductivity are set forth in Table I below.

TABLE I

| Doped Polyacetylene Film Composition* | Conductivity (25° C.) (ohm$^{-1}$ cm$^{-1}$) |
|---|---|
| trans-[(CH)(HBr)$_{0.04}$]$_x$ | 7 × 10$^{-4}$ |
| trans-(CHCl$_{0.02}$)$_x$ | 1 × 10$^{-4}$ |
| trans-(CHBr$_{0.05}$)$_x$ | 5 × 10$^{-1}$ |
| trans-(CHBr$_{0.23}$)$_x$ | 4 × 10$^{-1}$ |
| cis-[CH(ICl)$_{0.14}$]$_x$ | 5.0 × 10$^1$ |
| cis-(CHI$_{0.25}$)$_x$ | 3.6 × 10$^2$ |
| trans-(CHI$_{0.22}$)$_x$ | 3.0 × 10$^1$ |
| trans-(CHI$_{0.20}$)$_x$ | 1.6 × 10$^2$ |
| cis-[CH(IBr)$_{0.15}$]$_x$ | 4.0 × 10$^2$ |
| trans-[CH(IBr)$_{0.12}$]$_x$ | 1.2 × 10$^2$ |
| trans-[CH(AsF$_5$)$_{0.03}$]$_x$ | 7 × 10$^1$ |
| trans-[CH(AsF$_5$)$_{0.10}$]$_x$ | 4.0 × 10$^2$ |
| cis-[CH(AsF$_5$)$_{0.14}$]$_x$ | 5.6 × 10$^2$ |
| cis-[CH(AsF$_5$)$_{0.1}$]$_x$ | 8.8 × 10$^2$ |

*The prefix "cis" or "trans" refers to the predominant isomeric form of the polyacetylene in the film used in a given doping experiment.

Transport studies and far-infrared transmission measurements carried out on the above doped polyacetylene film samples indicated that those samples exhibiting room temperature conductivities greater than about 1 ohm$^{-1}$ cm$^{-1}$ have undergone the semiconductor-metal transition and exhibit conductivity properties characteristic of metallic behavior. As shown by the data in Table I, the method of the present invention enables the production of a whole family of electrically conducting doped polyacetylene films whose room temperature p-type electrical conductivity can be preselected and varied over a range of 11 orders of magnitude from that of an undoped cis-polyacetylene film. Moreover, at the higher end of the electrical conductivity range, the doped polyacetylene film exhibit electrical conductivities comparable to that obtained with single crystals of the organic metal tetrathiafulvalene-tetracyanoquinodimethane (TTF-TCNQ).

The embodiments of the invention in which an exclusive property or privilege is claimed are defined as follows:

1. In a method of selectively modifying the room temperature electrical conductivity of a semiconducting polyacetylene starting material by means of chemically doping said polyacetylene to p-type with a conductivity-increasing amount of an electron acceptor dopant, the improvement consisting of said polyacetylene starting material being in the form of a polycrystalline film, whereby the range of selectivity of the room temperature p-type electrical conductivity of the resulting doped material is broadened to extend over the entire range characteristic of semiconductor behavior and into the range characteristic of metallic behavior.

2. The method of claim 1, wherein said polyacetylene starting material is trans-polyacetylene.

3. The method of claim 1, wherein said polyacetylene starting material is cis-polyacetylene, or polyacetylene consisting of the cis and trans configurations in any relative amounts.

4. The method of claim 1, wherein the room temperature electrical conductivity of the starting polyacetylene film is increased to a preselected value by contacting said film in vacuum, in air, or in an inert gas, with the vapor of an electron acceptor dopant, whereby the polyacetylene becomes p-type and electron acceptor-doped with said dopant to a degree proportional with the contacting period, and dopant concentration, and controlling said contacting period and dopant concentration so that the corresponding degree of doping will be such as to provide the resulting acceptor-doped polyacetylene film with said preselected room temperature p-type electrical conductivity.

5. The method of claim 4, wherein said electron acceptor dopant is selected from the group consisting of bromine, iodine, iodine chloride, iodine bromide and arsenic pentafluoride.

6. The method of claim 5, wherein said preselected room temperature p-type electrical conductivity is within the range of from about 0.1 to of the order of 10$^3$ ohm$^{-1}$ cm$^{-1}$, said degree of doping is within the range of from about 0.001 to about 0.3 mol of electron acceptor dopant per —CH— unit of said polyacetylene, and said contacting period is within the range of from a few seconds to about twenty-four hours.

7. A p-type electrically conducting polycrystalline film of electron acceptor-doped polyacetylene exhibiting a room temperature electrical conductivity within the range of from about 0.1 to of the order of 10$^3$ ohm$^{-1}$ cm$^{-1}$.

8. The polycrystalline film of claim 7, wherein said doped polyacetylene contains from about 0.001 to about 0.3 mol of electron acceptor dopant per —CH— unit of the polyacetylene, and said electron acceptor dopant is selected from the group consisting of bromine, iodine, iodine chloride, iodine bromide and arsenic pentafluoride.

9. The polycrystalline film of claim 8, wherein said electron acceptor dopant is arsenic pentafluoride.

10. The polycrystalline film of claim 8, wherein the polyacetylene is trans-polyacetylene.

11. The polycrystalline film of claim 8, wherein the polyacetylene is cis-polyacetylene, or polyacetylene consisting of the cis and trans configurations in any relative amounts.

12. The polycrystalline film of claim 11, wherein said electron acceptor dopant is arsenic pentafluoride, said doped cis-polyacetylene contains about 0.1 mol of said dopant per —CH— unit of the polyacetylene, and said room temperature electrical conductivity is about 880 ohm$^{-1}$ cm$^{-1}$.

13. A p-type electrically conducting polycrystalline film of a polyacetylene which has been electron acceptor-doped in accordance with the method of claim 1.

* * * * *

UNITED STATES PATENT AND TRADEMARK OFFICE
CERTIFICATE OF CORRECTION

PATENT NO. : 4,222,903
DATED : September 16, 1980
INVENTOR(S) : Alan J. Heeger, et al.

It is certified that error appears in the above—identified patent and that said Letters Patent is hereby corrected as shown below:

Column 1, Line 8, "of" should read -- to --.

Column 1, Line 57, a hyphen should be inserted between "Ti(OC$_4$H$_9$)$_4$" and "Al(C$_2$H$_5$)$_3$".

Column 3, Line 22, "by" should read -- be -- .

Column 5, Line 45, "indicated" should read -- indicate --.

Signed and Sealed this

Twenty-fifth Day of November 1980

[SEAL]

Attest:

SIDNEY A. DIAMOND

Attesting Officer    Commissioner of Patents and Trademarks